United States Patent [19]

Sato et al.

[11] Patent Number: 4,867,839
[45] Date of Patent: Sep. 19, 1989

[54] PROCESS FOR FORMING A CIRCUIT SUBSTRATE

[75] Inventors: Takeshi Sato; Katsuya Fukase; Kiyotaka Shimada; Hirofumi Uchida, all of Nagano, Japan

[73] Assignee: Shinko Electric Industries Co., Ltd., Japan

[21] Appl. No.: 240,213

[22] Filed: Sep. 6, 1988

[30] Foreign Application Priority Data

Sep. 4, 1987 [JP] Japan ............................... 62-222392
Sep. 4, 1987 [JP] Japan ............................... 62-222393

[51] Int. Cl.⁴ ........................... C23F 1/02; B44C 1/22; C03C 15/00; C03C 25/06
[52] U.S. Cl. ..................... 156/630; 29/848; 156/634; 156/656; 156/659.1; 156/902; 204/30; 204/35.1; 204/20; 264/271.1; 427/98
[58] Field of Search ................. 29/846, 847, 848, 856, 29/858, 866, 242, 245, 247; 156/629, 630, 631, 634, 656, 659.1, 666, 902; 174/68.5; 204/29, 30, 35.1, 20, 22; 264/259, 261, 271.1, 272.11, 272.14, 272.15, 273, 275, 277, 279; 361/397, 401, 406; 427/96, 98

[56] References Cited

U.S. PATENT DOCUMENTS 4,774,122  9/1988  Adler ............................ 156/630 X

FOREIGN PATENT DOCUMENTS

| 57-152193 | 9/1982 | Japan . |
| 57-186393 | 11/1982 | Japan . |
| 57-193092 | 11/1982 | Japan . |
| 60-121791 | 6/1985 | Japan . |
| 60-138988 | 7/1985 | Japan . |
| 61-1088 | 1/1986 | Japan . |
| 61-96795 | 5/1986 | Japan . |
| 61-210691 | 9/1986 | Japan . |
| 62-33493 | 2/1987 | Japan . |

Primary Examiner—William A. Powell
Attorney, Agent, or Firm—Staas & Halsey

[57] ABSTRACT

A process for forming a circuit substrate comprising placing an electrodeposited metal foil having a rough surface provided with a large number of fine projections in a cavity of a mold in such a manner that the rough surface faces an inside of the mold cavity; pouring a melting resin into the mold cavity to form a molded article; peeling the metal foil from the molded article to form a large number of fine concavities corresponding to the projections; electroless-plating the resin base to form a metal film; and photoetching to form a circuit pattern on the resin base.

14 Claims, 4 Drawing Sheets

PROCESS FOR FORMING A CIRCUIT SUBSTRATE

BACKGROUND OF THE INVENTION

1. Field of the Invention

This invention relates to a process for making a circuit substrate, such as a package for mounting a semiconductor device or chip.

2. Description of the Related Art

Conventionally, several kinds of circuit substrate are known in which a circuit pattern is formed on a resin base and a plurality of metal leads are connected to the circuit pattern, such as a printed circuit board (PCB) or a package for mounting a semiconductor chip.

Several methods of forming such a circuit pattern on the resin base, are also known; for example, an electrodeposited copper foil is adhered to a surface of a resin base by a heat transfer or by an adhesive and then photoetched to form a fine circuit pattern. Alternatively, a plated film is formed on the surface of the resin base and then photoetched to form a fine circuit pattern.

According to the former method, however, if the surface of the resin base is provided with a recess for mounting a semiconductor chip, the electrodeposited copper foil can not be satisfactory adhered to a side or bottom wall of the above-mentioned recess, and thus a three-dimensional circuit pattern can not be easily formed on such a resin base.

According to the latter method, the surface of the resin base is usually electroless-plated to form a plated film thereon, and to ensure that the plated film is fixedly attached to the resin base, conventionally a surface thereof is roughened by an etching agent.

In a package for mounting a semiconductor chip or PCB, however, a material constituting the resin base must have a satisfactory heat resistance or acid resistance, or strength such as, for example, an engineering plastic including glass fillers, since the package for this purpose is usually highly sophisticated. On the other hand, the etching agent for roughening the surface of such a resin base must be an acid having a strong action, for example, nitric acid, sulfuric acid, fluoric acid, or the like. In other words, the material for the resin base must have etching characteristics such that it can be etched by these etching agents, and if such requirements are met, a highly sophisticated package can not be obtained. Therefore, it is difficult to appropriately select a material for the resin base, and the etching agent.

Also, if the resin base includes any stressed portion due to a molding process, cracks may occur or the etching speed may not be always the same when the resin base is etched, and therefore, the surface of the resin base will not be even and a thickness of the plated film formed thereon may be uneven.

In a package for mounting a semiconductor chip, advantageously metal parts, such as metal leads for connecting the circuit pattern to external circuits or lines, or a metal heat sink are integrally mounted within the resin base. But, if the resin base is dipped in a strong etching agent, these metal parts may be melted or damaged. In such a case, before etching, the surface of the resin base on which the metal parts are exposed is usually coated with a protective resist. But, the peripheral portions of metal parts on the resin base are unnecessarily covered with the protective resist, and a plated film having good adhesive characteristics can not be formed on these portions covered with the protective resist at a later stage.

SUMMARY OF THE INVENTION

An object of the present invention is to provide a process for forming a circuit substrate in which a conductive circuit pattern is firmly attached to a surface of a resin base.

Another object of the present invention is to provide a process for forming a circuit substrate by which the above-mentioned problems can be overcome.

According to the present invention, there is provided a process for forming a circuit substrate, comprising the following steps of: placing an electrodeposited metal foil, having a rough (or mat) surface providing with a large number of fine projections into a cavity of a mold in such a manner that the rough surface faces an inside of the mold cavity; pouring a melting resin into the mold cavity to form a molded article comprising a resin base to which the electrodeposited metal foil is adhered; peeling the electrodeposited metal foil from the molded article to form, on a surface of the resin base, a large number of fine concavities corresponding to the projections of said electrolysis metal; electroless-plating the surface of the resin base, on which the fine concavities have been formed, with a desired conductive metal to form a metal film on the resin base; and, etching the metal film to form a desired electrical circuit pattern on the resin base.

DESCRIPTION OF THE PREFERRED EMBODIMENTS

Figure 1:
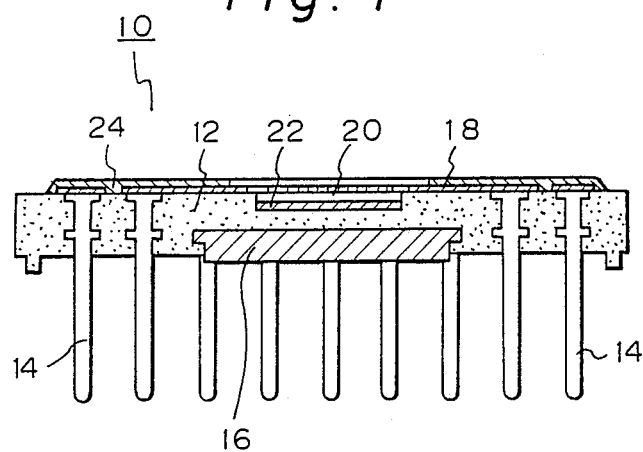
FIG. 1 is a cross-sectional view of a circuit substrate such as package for mounting a semiconductor package, formed in accordance with a process of this invention.

FIG. 1 shows a circuit substrate 10 which is used, for example, as a package for mounting a pin-grid array (PGA) type semiconductor device. The package 10 comprises a resin base 12 in which metal leads 14 for connecting external circuits or lines (not shown) and a heat sink 16 are inserted and integrally molded. The upper ends of the metal leads 14 are exposed at the upper surface of the resin base 12, and the lower face of the heat sink 16 is exposed at the lower surface of the resin base 12, for effective heat radiation.

A circuit pattern 18 is formed on the upper surface of the resin base 12 by electroless-plating with copper, and is electrically connected to the upper ends of the metal leads 14. A recess 20 for mounting a semiconductor chip is formed at a central portion on the upper surface of the resin base 12, and the bottom surface of the recess 20 is also electroless-plated with a copper film 22. A semiconductor chip (not shown) is accommodated in the recess 20 and electrically connected to the circuit pattern 18 via bonding wires (not shown), in a subsequent step of make a semiconductor device, as known in the prior art.

Other films also may be formed on the circuit pattern 18, by electro or electroless-plating copper, nickel, gold, or the like. Also, the circuit pattern 18 can be covered with a protective resist film 24, except for the wire-bonding areas and an inside surface of the recess 20.

Figure 2:
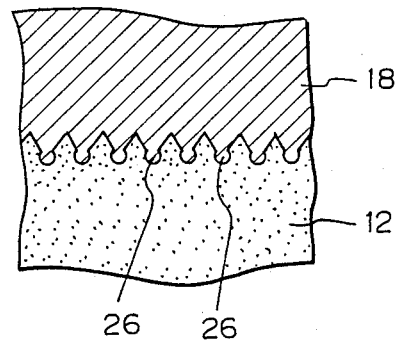
FIG. 2 is a partial cross-sectional view illustrating a circuit pattern firmly attached to a resin base.

FIG. 2 is a cross-sectional view of a part of the package shown in FIG. 1, particularly a portion in which the circuit pattern 18 is firmly attached to the resin base 12. The resin base 12 is provided on the upper surface thereof with a large number of fine concavities 26 each having, in a cross-section thereof, a shape such that an inlet or opened portion thereof is narrow and an interior thereof is enlarged. Conversely, the circuit pattern 18 consisting of an electroless-plated metal, such as copper, is buried as a thin film in the fine concavities 26 of the resin base 12, so that the circuit pattern 18 is rigidly secured to the surface of the resin base 12 by the anchoring effects of the fine concavities 26. These anchoring effects are strengthened due to the other films of copper, nickel, gold, or the like which are electro or electroless-plated on the circuit pattern 18.

Thus, according to the present invention, the circuit pattern 18 is fixedly attached to the surface of the resin base 12 by the anchoring effects as mentioned above. It should be noted that these anchoring effects can be also obtained, if the above-mentioned concavities 26 have, in a cross-section thereof, a shape such that an intermediate portion is necked, i.e., constricted, in addition to the above-mentioned shape.

A process for forming a circuit substrate, particularly a package as shown in FIG. 1, will now be described with reference to FIGS. 3 and 4A–4D.

Figure 3:
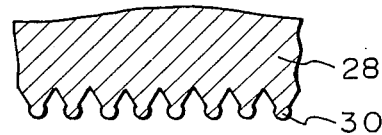
FIG. 3 is a partial cross-sectional view of an electrodeposited copper foil.

FIG. 3 is a partial cross-sectional view showing an electrodeposited copper foil 28 formed by an electrodepositing process, comprising the following steps of: (1) forming a copper layer on a peripheral mirror surface of a drum-like electrode and (2) exfoliating the copper layer from the drum-like electrode. Accordingly, the electrodeposited copper foil 28 thus-obtained has one surfaces which is as smooth (or shiny) as a mirror face and another surface on which electrolytes, i.e., copper particles, are accumulated to form a rough (or mat) surface. Copper oxide particles are then attached to the rough surface, on which a barrier layer is further formed by plating with brass, zinc or the like, and the barrier layer is then subjected to a treatment such as a rust preventing chromadizing process, and thus the rough surface becomes further roughened as mentioned above, so that the rough surface has, in a cross-section thereof, a large number of fine projections 30 having enlarged tops.

Figure 4A:
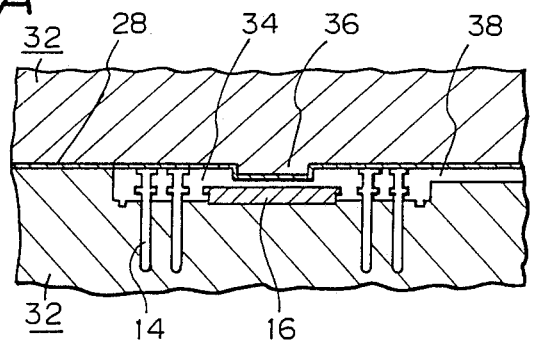
FIGS. 4A–4D are cross-sectional view illustrating a process for forming a circuit substrate according to the present invention.
Figure 4B:
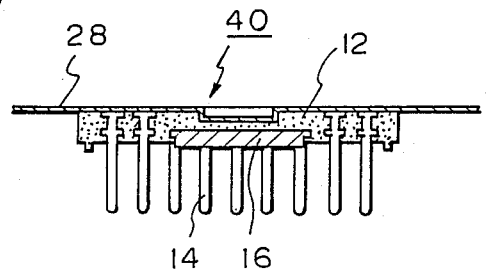

As shown in FIG. 4A, the electrodeposited copper foil 28 is placed in a metal mold 32 and precisely positioned in such a manner that the smooth surface thereof is in contact with an inner wall of a cavity 34 and the rough surface thereof faces the inside of the cavity 34. A plurality of metal leads 14 and a heat sink 16 are also placed in the mold 32 and precisely placed at predetermined positions. The metal mold 32 has a projection 36 for forming the above-mentioned recess 20 for mounting a semiconductor chip. Subsequently, a melting resin is poured into the cavity 34 through an inlet port 38, and a molded article 40 as shown in FIG. 4B is obtained.

Figure 4C:
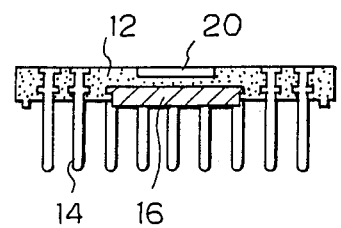

The electrodeposited copper foil 28 is then peeled from the surface of the resin base 12 as shown in FIG. 4C, so that the fine projections 30 of the copper foil 28 are withdrawn from the resin base 12, and therefore, the above-mentioned fine concavities 26 remain on the resin base 12 in correspondence to the fine projections 30 of the copper foil 28. Each of the fine concavities 26 has a shape such that an inlet or opened portions is narrow and an interior is enlarged, as mentioned above. These fine concavities 26 are also formed on the resin base 12 in the vicinity of the metal leads 14 which are exposed at the upper surface of the resin base 12, and on the inside wall of the chip mounting recess 20.

Figure 4D:
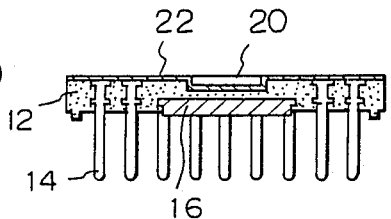

Then, as shown in FIG. 4D, the upper surface of the resin base 12 having the above-mentioned fine concavities 26 is electroless-plated over substantially the entire surface thereof, with a copper film 22, by a known process. This electroless-plated copper film 22 is also deposited advantageously on the upper ends of the metal leads 14, to form a firm contact therewith.

The electroless-placed copper film 22 thus formed is subjected to a photoetching process to form a circuit pattern 18, and thus a package for semiconductor devices is obtained, as shown in FIG. 1, in which the circuit pattern 18 is formed on the upper surface of the resin base 12.

Another process for forming a package will now be described with reference to FIGS. 5A–5D.

In this embodiment, the above-mentioned electrodeposited copper foil 28 is previously attached to a resin sheet 42 made of a heatproof flexible resin such as polyimide or the like, via an appropriate adhesive, in such a manner that the smooth surface of the copper foil 28 is in contact with the resin sheet 42. Also, the electrodeposited copper foil 28 on the resin sheet 42 is previously photoetched to form a desired circuit-like pattern.

Figure 5A:
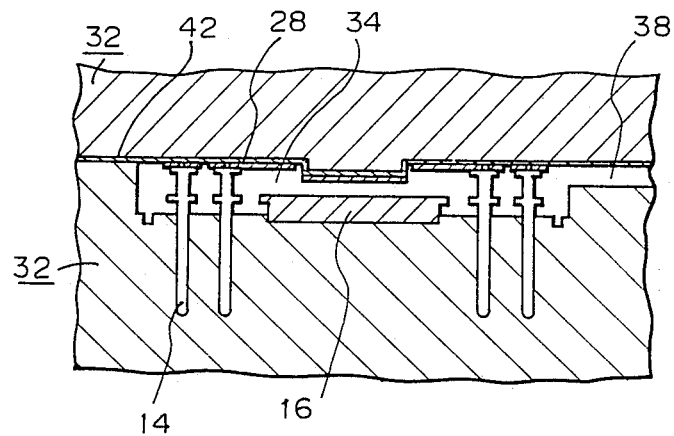
FIGS. 5A–5D are cross-sectional views illustrating another process for forming a circuit substrate according to the present invention; and, FIGS. 6A–6D are cross-sectional views illustrating still another process for forming a circuit substrate according to the present invention.
Figure 5B:
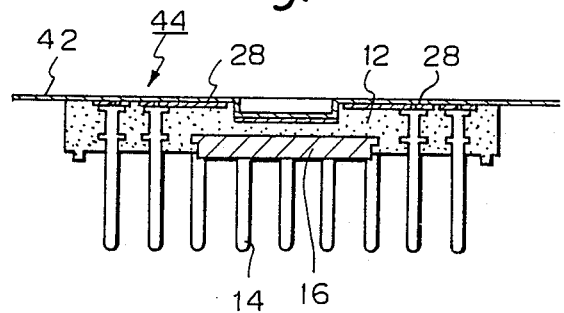

As shown in FIG. 5A, the resin sheet 42 on which the electrodeposited copper foil 28 has been formed is placed in a metal mold 32 and precisely positioned in such a manner that the resin sheet 42 is directly in contact with an inner wall of a cavity 34 and the rough surface of the copper foil 28 (i.e., the circuit-like pattern) faces the inside of the cavity 34. A plurality of metal leads 14 are also placed in the mold 32 so as to come into contact with the copper foil 28. Also, a heat sink 16 is placed in the mold 32 at a predetermined position. Subsequently, a melting resin is poured into the cavity 34 through an inlet port 38, and molded article 44 as shown in FIG. 5B is obtained.

Figure 5C:
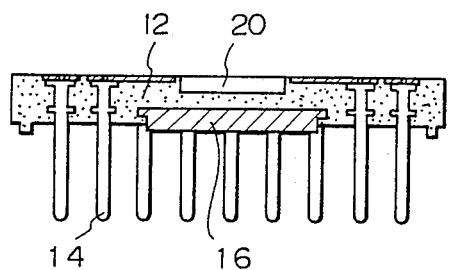

The resin sheet 42 is then peeled, together with the copper foil 28, from the surface of the resin base 12 as shown in FIG. 5C, and thus the fine concavities 26 (FIG. 2) remain on the resin base 12 in correspondence to the fine projections 30 of the copper foil 28. Note, the fine concavities 26 are formed along a circuit-like pattern formed on the resin base 12 corresponding to the copper foil 28.

Figure 5D:
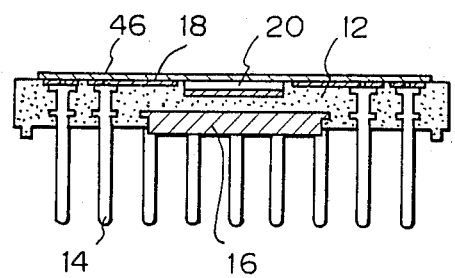

As shown in FIG. 5D, the upper surface of the resin base 12 is coated with a resist 46, except for the circuit-like pattern, so that a circuit conductive pattern 18 can be formed on the resin base 12 by electroless-plating with copper, in the same manner as mentioned above.

In this embodiment, the electrodeposited copper foil 28 on the flexible resin sheet 42 previously formed, as a circuit-like pattern, and the resin sheet 42 can be easily placed along an uneven inner face of the cavity 34.

Accordingly, a circuit pattern also can be formed, for example, on the bottom and/or side walls of the recess 20 for mounting a semiconductor chip which is stepped to a lower level than the surface of the resin base 12 on which the main circuit pattern 18 is formed. Therefore, it becomes possible to easily form any desired three-dimensional circuit.

FIGS. 6A–6D show still another process for forming package similar to the embodiment of FIGS. 4A–4B.

Figure 6A:
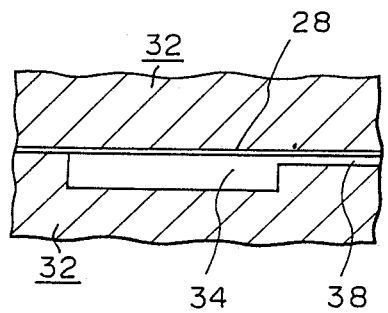
Figure 6B:
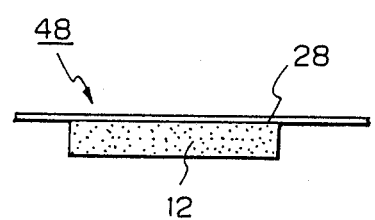

In this embodiment, as shown in FIG. 6A, an electrodeposited copper foil 28 having a smooth surface and a rough surface is first placed in a metal mold 32 in such a manner that the smooth surface thereof is in contact with an inner wall of a cavity 34 and the rough surface thereof faces the inside of the cavity 34, in the same manner as FIG. 4A, and then a melting resin is poured into the cavity 34 through an inlet port 38, so that a molded article 48 is obtained as shown in FIG. 6B.

Figure 6C:
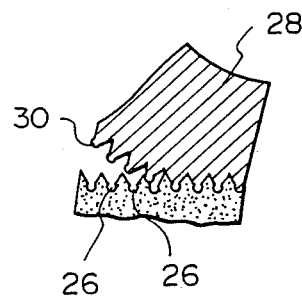
Figure 6D:
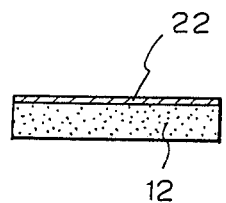

The electrodeposited copper foil 28 is then peeled from the surface of the resin base 12 as shown in FIG. 6C, so that the fine projections 30 of the copper foil 28 are withdrawn from the resin base 12, and therefore, the above-mentioned fine concavities 26 remain on the resin base 12 in correspondence to the fine projections 30 of the copper foil 28. The fine concavities 26 each have a shape such that an inlet or opened portion thereof is narrow and an interior thereof is enlarged, as mentioned above. Then, as shown in FIG. 6D, the upper surface of the resin base 12 is electroless-plated over substantially the entire surface thereof with a copper film 22, by a known process.

In the embodiments mentioned above, although an electrodeposited copper foil 28 is used, any electrodeposited metal foil having a large number of projections similar to the fine projections indicated at 30 also can be used. Further, metals other than copper, such as nickel, gold, or the like, also can be electroless-plated on the surface of the resin base 12.

The present invention can be applied not only to a package for semiconductor devices, as mentioned above, but also to any other printed circuit board (PCB), such as a PCB having a circuit pattern which is to be electrically connected to metal leads, or any other circuit boards or substrates.

We claim:

1. A process for forming a circuit substrate, comprising the following steps of:
    placing an electrodeposited metal foil having a rough surface provided with a large number of fine projections in a cavity of a mold in such a manner that said rough surface faces an inside of said mold cavity;
    pouring a melting resin into said mold cavity to form a molded article comprising a resin base to which said electrodeposited metal foil is adhered;
    peeling said electrodeposited metal foil from said molded article to form, on a surface of said resin base, a large number of fine concavities corresponding to said projections of said electrolysis metal;
    electrolysis-plating said surface of the resin base, on which said fine concavities have been formed, with a desired conductive metal to form a metal film on said resin base; and,
    etching said metal film to form a desired electrical circuit pattern on said resin base.

2. A process as set forth in claim 1, wherein each of said fine projections of said electrodeposited metal foil has an enlarged top.

3. A process as set forth in claim 2, wherein said metal foil is an electrodeposited copper foil.

4. A process as set forth in claim 1, wherein a plurality of metal leads are also placed in said mold cavity in such a manner that one ends of said metal leads are in contact with said electrodeposited metal foil placed in said mold cavity, so that a circuit substrate is obtained in which at least a part of each of said metal lead is buried and integrally molded within said resin base.

5. A process for making a circuit substrate, comprising the following steps of:
    firmly attaching an electrodeposited metal foil having a smooth surface and a rough surface provided with a large number of fine projections onto a heatproof flexible base sheet in such a manner that said smooth surface of said electrodeposited metal foil is directly in contact with said base sheet;
    placing said base sheet in a cavity of a mold in such a manner that said rough surface of said electrodeposited metal foil faces an inside of said mold cavity;
    pouring a melting resin into said mold cavity to form a molded article comprising a resin base to which said base sheet is adhered;
    peeling said base sheet accompanying said electrodeposited metal foil from said molded article to form, on a surface of said resin base, a large number of fine concavities corresponding to said projections of said electrolysis metal;
    electroless-plating said surface of the resin base on which said fine concavities have been formed with a desired conductive metal to form a metal film on said resin base; and,
    etching said metal film to form a desired electrical circuit pattern on said resin base.

6. A process as set forth in claim 5, wherein said heatproof flexible base sheet consists of a resin such as polyimide or the like.

7. A process as set forth in claim 5, wherein said mold has a cavity wall providing with a projection protruding toward the inside of said cavity and said base sheet is placed in said mold cavity in such a manner that said base sheet is in contact with said cavity wall, so that a resin base having a recess corresponding to said projection, for mounting a semiconductor chip therein, is obtained.

8. A process as set forth in claim 7, wherein said recess of said resin base has a bottom and side walls, at least said bottom wall of the projection is also formed in the same way as said rough surface and said electroless-plated metal film is also formed on said bottom wall.

9. A process as set forth in claim 5, wherein each of said fine projections of said electrodeposited metal foil has an enlarged top.

10. A process as set forth in claim 5, wherein said metal foil is an electrodeposited copper foil.

11. A process as set forth in claim 5, wherein a plurality of metal leads are also placed in said mold cavity in such a manner that one ends of said metal leads are in contact with said electrodeposited metal foil placed in said mold cavity, so that a circuit substrate is obtained in which at least a part of each of said metal leads is buried and integrally molded within said resin base.

12. A process for forming a circuit substrate, comprising the following steps of:

firmly attaching an electrodeposited metal foil having a smooth surface and a rough surface provided with a large number of fine projections onto a heatproof flexible base sheet in such a manner that said smooth surface of said electrodeposited metal foil is directly in contact with said base sheet;

etching said electrodeposited metal foil on the base sheet to form a circuit-like pattern on said base sheet;

placing said base sheet in a cavity of a mold in such a manner that said rough surface of said patterned electrodeposited metal foil faces an inside of said mold cavity;

pouring a melting resin into said mold cavity to form a molded article comprising a resin base to which said base sheet is adhered;

peeling said base sheet accompanying said patterned electrodeposited metal foil from said molded article to form, along a circuit-like pattern corresponding to said circuit-like pattern on said base sheet, on a surface of said resin base, a large number of fine concavities corresponding to said projections of said patterned electrolysis metal;

covering said surface of the resin base with a resist, except for said circuit-like pattern formed on said resin base; and, electroless-plating said surface of the resin base with a desired conductive metal to form an electrical circuit pattern corresponding to said circuit-like pattern on said resin base.

13. A process for forming an electroless-plated film on a resin base, comprising the following steps of:

placing an electrodeposited metal foil having a rough surface provided with a large number of fine projections in a cavity of a mold in such a manner that said rough surface faces an inside of said mold cavity;

pouring a melting resin into said mold cavity to form a molded article comprising a resin base to which said electrodeposited metal foil is adhered;

peeling said electrodeposited metal foil from said molded article to form, on a surface of said resin base, a large number of fine concavities corresponding to said projections of said electrolysis metal; and, electroless-plating said surface of the resin base, on which said fine concavities are formed.

14. A process for forming an electroless-plated film on a resin base, comprising the following steps of:

firmly attaching an electrodeposited metal foil having a smooth surface and a rough surface provided with a large number of fine projections onto a heatproof flexible base sheet in such a manner that smooth surface of said electrodeposited metal foil is directly in contact with said base sheet;

placing said base sheet in a cavity of a mold in such a manner that said rough surface of said electrodeposited metal foil faces an inside of said mold cavity;

pouring a melting resin into said mold cavity to form a molded article comprising a resin base to which said base sheet is adhered;

peeling said base sheet accompanying said electrodeposited metal foil from said molded article to form, on a surface of said resin base, a large number of fine concavities corresponding to said projections of said electrolysis metal; and, electroless-plating said surface of the resin base, on which said fine concavities have been formed, with a desired conductive metal to form a metal film on said resin base.

* * * * *